United States Patent [19]

Gonzalez-Lepera

[11] Patent Number: 5,502,303
[45] Date of Patent: Mar. 26, 1996

[54] ELECTRONIC PHANTOM SOURCE FOR GAMMA-RAY CAMERAS

[75] Inventor: Carlos Gonzalez-Lepera, Wallingford, Pa.

[73] Assignee: Trustees of the University of Pennsylvania, Philadelphia, Pa.

[21] Appl. No.: 282,524

[22] Filed: Jul. 28, 1994

[51] Int. Cl.$^6$ .............................. G01T 1/164; H01J 37/06
[52] U.S. Cl. .................................... 250/252.1; 250/363.09
[58] Field of Search ......................... 250/252.1, 363.03, 250/363.09, 308

[56] References Cited

U.S. PATENT DOCUMENTS

| | | | |
|---|---|---|---|
| 4,499,375 | 2/1985 | Jaszczak | 250/252.1 |
| 4,618,826 | 10/1986 | Smith et al. | 324/308 |
| 4,716,225 | 12/1987 | Ledley et al. | 536/122 |
| 4,748,328 | 5/1988 | Chang et al. | 250/363 R |
| 4,980,552 | 12/1990 | Cho et al. | 250/363.03 |
| 5,071,602 | 12/1991 | Nambu et al. | 264/28 |
| 5,159,195 | 10/1992 | Van House | 250/308 |

FOREIGN PATENT DOCUMENTS

| | | | |
|---|---|---|---|
| 6044934 | 2/1994 | Japan | 250/363.03 |

OTHER PUBLICATIONS

Biodex Catalog, "Nuclear Medicine Supplies and Accessories", Catalog 78, Spring 1994, pp. 20–29.
G. R. Brandes et al., "Positron Workfunction of Diamond C(100) Surfaces", Materials Science Forum, vols. 105–110 (1992), pp. 1363–1366.
G. R. Brandes, "Scanning Positron Microbeam", Rev. Sci. Instrum. 59 (2), Feb. 1988, pp. 228–232.
M. Charlton et al., "The Production of Low Energy Positrons and Positronium", Hyperfine Interactions 76 (1993), pp. 97–113.
D. M. Chen, "Measurement of Positron Reemission from Thin Single–Crystal W(100) Films", Physical Review B, Third Series, vol. 31, No. 7, Apr. 1, 1985.
W. E. Frieze, "Positron–Beam–Brightness Enhancement: Low–Energy Positron Diffraction and Other Applications", Physical Review B, vol. 31, No. 9, May 1, 1985, pp. 5628–5633.
E. Gramsch, "Development of Transmission Positron Moderators", Appl. Phys. Lett. 51 (22), Nov. 30, 1987, pp. 1862–1864.
R. Khatri, "Improvement of Rare–Gas Solid Moderators by Using Conical Geometry", Appl. Phys. Lett. 57 (22), Nov. 26, 1990, pp. 2374–2376.

(List continued on next page.)

Primary Examiner—Davis L. Willis
Assistant Examiner—Richard Hanig
Attorney, Agent, or Firm—Woodcock Washburn Kurtz Mackiewicz & Norris

[57] ABSTRACT

A slow positron source having a cylindrical geometry which permits increased conversion efficiency from high energy into low energy positrons. A thin walled inner cylinder is filled with a positron emitting liquid radioisotope and is separated from an outer cylinder by an annular cavity. The outer cylinder surrounds the inner cylinder and is coated with a high atomic number material thick enough to stop all the positrons while providing a high fraction of backscattered positrons. A thin layer of moderator is also deposited on the inner surface of the outer cylinder. A positively biased pusher disk is placed at one end of the cylinders, while a negatively biased extraction grid is placed at the other end of the cylinders for extracting the low energy moderated positrons from the cavity so as to form a substantially monoenergetic positron beam. The positron beam is directed to impinge upon an annihilation screen at selected points using standard CRT focusing and deflection arrangements. The positron beam is controlled to create a desired phantom image on the annihilation screen. The gamma rays produced by the impingement of the positron beam on the annihilation screen are advantageously measured by a PET or SPECT camera and may be used to calibrate resolution, field of view, and the like of such gamma ray cameras.

24 Claims, 7 Drawing Sheets

OTHER PUBLICATIONS

K. G. Lynn et al., "Development of a Cone–Geometry Positron Moderator", Appl. Phys. Lett. 55 (1), Jul. 3, 1989, pp. 87–89.

G. R. Massoumi et al., "Doubly Differential Positron–Backscattering Yields", Physical Review B, vol. 44, No. 7, Aug. 15, 1991, pp. 3486–3489.

G. R. Massoumi et al., "Positron Emission Yields for Encapsulated $^{22}$Na Sources", Nuclear Instruments and Methods in Physics Research B30, 1988, pp. 592–597.

A. P. Mills et al., "Solid Neon Moderator for Producing Slow Positrons", Appl. Phys. Lett. 49 (17), Oct. 27, 1986, pp. 1121–1123.

P. J. Schultz, "Transmitted Positron Reemission from a Thin Single–Crystal Ni (11) Foil", Physical Review B, vol. 34, No. 1, Jul. 1, 1986, pp. 442–444.

M. Charlton et al., "Experimentation with Thin Single Crystal W Foils as Slow Positron Transmission Mode Moderators", Appl. Phys. A 47, 1988, pp. 409–412.

A. Vehanen, "Thin Films for Slow Positron Generation", Appl. Phys. A, 1985, pp. 97–101.

D. G. Costello, "Evidence for the Negative Work Function Associates with Positrons in Gold", Physical Review B, vol. 5, No. 4, Feb. 15, 1972, pp. 1433–1438.

K. F. Canter, "Measurement of Total Cross Sections for Low Energy Positron–Helium Collisions", J. Phys. B: Atom. Molec. Phys. 1, vol. 5, Aug. 1972, pp. L165–L169.

ELECTRONIC PHANTOM SOURCE FOR GAMMA-RAY CAMERAS

FIELD OF THE INVENTION

The present invention relates to a phantom for γ-ray cameras, and more particularly, to an electronic phantom source for PET and SPECT which enables the creation of arbitrary phantom images within PET and SPECT cameras.

BACKGROUND OF THE INVENTION

Intense research to improve the characteristics of γ-ray detectors together with major developments in electronics and computer technology has turned Positron Emission Tomography (PET) and Single Photon Emission Computer Tomography (SPECT) into powerful research and clinical tools. However, currently available calibration phantoms used for research and quality control of detector and camera performance do not have the same degree of sophistication. Typical calibration phantoms comprise pre-formed cavities for containing a liquid radioisotope. These cavities are supported by mechanical structures and placed within the PET and SPECT cameras. Based on their intrinsic geometry or through manual (or remote) motion of the phantom, different characteristics of the camera under study can be obtained from the resulting phantoms. Sample phantoms are described by Jaszczak in U.S. Pat. No. 4,499,375, by Smith et al. in U.S. Pat. No. 4,618,826, and by Nambu et al. in U.S. Pat. No. 5,071,602, and are advertised for purchase in the BIODEX Medical Catalog, among other sources. While phantoms such as so-called Hoffman phantoms are available in many shapes and sizes, such phantoms unfortunately require source collimation to reduce background effects and are restricted in location and distribution of the radioisotope. These limitations, among others, make the current techniques for generating phantoms less than ideal.

As known by those skilled in the art, the PET cameras and SPECT cameras calibrated by such phantoms are used to generate images of body tissues and organs for determining metabolic functions and the like. SPECT does not rely on positron emitters to function. Their operation is instead based on gamma emitting radioisotopes (single photon), although positron emitting radioisotopes have also been used in several applications. As described, for example, in U.S. Pat. No. 4,748,328 to Chang et al., the contents of which are hereby incorporated by reference, SPECT cameras only record one event per detected photon. As described, for example, in U.S. Pat. No. 4,980,552 to Cho et al., also hereby incorporated by reference, PET cameras instead record the simultaneous arrival of two photons (in coincidence) to define an event. In PET, by following the respective gamma rays back to their point of emission, the location within the patient's tissue or organ of the source of the detected gamma rays may be determined, thus providing a method of determining the path of the radioisotopes through the patient and hence useful diagnostic information such as metabolic functioning. The present invention is designed for use with PET and SPECT or with any other instrument capable of detecting gamma rays.

Prior to examination with PET or SPECT cameras, a quickly decaying radionuclide such as a radiopaque sugar derivative is administered to a patient. As the radionuclide is absorbed by the patient, it becomes distributed in accordance with the patient's unique physiological functions and/or anatomy. Then, as these radionuclides decay, positrons are emitted from the radionuclide which have a fairly broad energy distribution. Depending on the radionuclide, the end point energy can be more than 1 MeV. These very energetic particles travel a certain distance (typically a few millimeters in human tissue) before losing all of their energy and recombining with an electron to produce two oppositely directed gamma rays. Due to momentum conservation, the ejection angle for these gamma rays is slightly different from 180 degrees. The resulting pair of 511 keV gamma rays are measured by the PET camera. Generally, the image obtained with such a very small positron emitting source such as a point source will show a blurring effect due to the finite positron range. It is desired to develop a phantom which does not suffer from this problem by making the beam monoenergetic and the range for positrons at the proposed acceleration energy very small (tenths of a micrometer or less).

Radioisotopes are desirable since they may be safely administered to a patient yet emit electromagnetic radiation (gamma-rays) over a broad range, either as a direct result of nuclear decay (SPECT) or as a consequence of positron-electron annihilation (PET and SPECT). However, in order to detect the resulting gamma ray fluxes, the cameras must be very sensitive and must be regularly calibrated. An efficient phantom calibration technique is thus desirable.

The present invention operates based on the principle of "positron moderation" to replace the aforementioned prior art mechanical phantoms with electronically generated phantoms. Although the process of positron moderation in solids has been known for many years, moderation yields near 0.5% and brightness enhancement of slow positron beams was only recently demonstrated using highly sophisticated techniques such as those described by Mills, Jr. et al. in an article entitled "Solid Neon Moderator for Producing Slow Positrons," Appl. Phys. Lett., Vol. 49, pp. 1121–1123 (1986). In general, the term "positron moderation" refers to the physical processes where a high energy positron (>10 keV) loses its energy to the interacting media and is finally ejected from the degrading material with relatively low energy (<10–20 eV). Those skilled in the art will appreciate that energetic positrons implanted into a solid surface will reach thermal equilibrium with the lattice in a few picoseconds. Diffusion of the positrons then takes place in a larger time scale (~100 psec.), and different processes occur depending on the properties of the material. In a metal, annihilation with electrons is the predominant event, although, as noted by Charlton et al. in an article entitled "The Production of Low Energy Positrons and Positronium," Hyperfine Interactions, Vol. 76, pp. 97–113 (1993), positrons can be reemitted from the surface (as well as positronium) if their workfunction is negative. Charlton et al. noted that, in insulators, after cooling down below the band gap, positrons can only lose energy through phonon emission and diffusion takes place over large distances. Defects in the crystal lattice also act as trapping centers which diminish the reemission process. However, in spite of a positive affinity, positrons can be ejected from insulators if some of their energy still remains when they reach the surface. Chen et al. in an article entitled "Measurement of Positron Reemission From Thin Single-Crystal W(100) Films," Phys. Rev. B, Vol. 31, No. 7, pp. 4123–4130, Apr. 1, 1985, and Schultz et al. in an article entitled "Transmitted Positron Reemission From a Thin Single-Crystal Ni(100) Foil," Phys. Rev. B, Vol. 34, No. 1, pp. 442–444, Jul. 1, 1986, have investigated several metallic crystals and established efficiencies for slow positron reemission near $10^{-3}$.

First reports of positron moderation with efficiencies in the $10^{-6}$–$10^{-7}$ range appeared in the early 1970's, and it took more than a decade to bring that number into the $10^{-3}$ range. Positron moderation in solids has several advantages over the conventional energy selection technique offered by standard β-ray spectrometers. For example, positrons are reemitted with a few eV energies. Also, the energy width of the moderated beam is very narrow (typically limited by the positrons thermal energy in the lattice), and emission takes place normal to the surface with a relatively small angular spread. These two features already make positron moderation techniques very attractive for experiments that require good energy resolution. Indeed, when process efficiency is compared, positron moderation is at least two orders of magnitude higher even for spectrometers with wide energy windows (>50 keV).

Two different geometries are commonly used for positron moderation: back reemission and forward transmission. In the back reemission geometry, a sizable portion of the moderated positrons is absorbed by the primary source itself. Forward transmission-reemission, on the other hand, facilitates electromagnetic configuration for beam acceleration and focusing but has some practical limitations due to fixed foil thickness, complexity of crystal preparation, and removal of the high energy contamination from the moderated beam. Insulators such as MgO and solid rear gases are selected based on their long diffusion length for hot (eV energy) positrons, while single (W(100), Ni(100)) and polycrystalline metals present negative affinity for positrons.

Except for a few laboratories with accelerators capable of positron production through pair creation, most of the work with positron moderators has been carried out by using positron emitting radioactive sources. On the basis of half-life, intensity, branching ratios for positron emission and commercial availability, $^{22}$Na (2.6 year half-life) is the source of preference. Typical source intensities range from μCi to tens of mCi with a few groups capable of affording and handling several hundred mCi. However, despite being accelerator produced, those skilled in the art will appreciate that short-lived positron emitters such as $^{18}$F (109.8 minute half-life), $^{11}$C (20 minute half-life), $^{13}$N (10 minute half-life) and $^{15}$O (2 minute half-life) are also advantageous in that they have very high specific activities. For example, standard techniques deliver up to 1 Ci/ml of $^{18}$F from a proton irradiated $^{18}$O(H$_2$O) target without any further processing. Also, such positron emitters permit a short development time for new source configurations and provide a minimal residual contamination of components.

To date, only a few attempts have been made to increase positron moderation yields based on source geometry. For example, Gramsch et al. in an article entitled "Development of Transmission Positron Moderators," Appl. Phys. Lett., Vol. 51, No. 22, pp. 1862–1864 (Nov. 30, 1987) describe several thin film moderators, while Lynn et al. in an article entitled "Development of a Cone-Geometry Positron Moderator," Appl. Phys. Lett., Vol. 55, No. 1, pp. 87–89 (Jul. 3, 1989) and Khatri et al. in an article entitled "Improvement of Rare-Gas Solid Moderators By Using Conical Geometry," Appl. Phys. Lett., Vol. 57, No. 22, pp. 2374–2376 (Nov. 26, 1990) describe cylindrical and cone configurations for the positron moderator. It is desired to develop a new source geometry which provides increased conversion efficiency from high energy into low energy (few eV) positrons based on relatively standard materials and techniques. Such a source geometry also should facilitate use of the source as a positron phantom source for use in calibrating γ-ray cameras without the inherent limitations of prior art phantoms and which takes advantage of advances in the efficiencies of positron moderation to form low energy positron electronic phantom sources from standard positron emission materials. The present invention has been designed to meet these needs.

SUMMARY OF THE INVENTION

The present invention relates to a slow positron source having a new geometry which provides increased conversion efficiency from high energy into low energy (few eV) positrons based on relatively standard materials and techniques. Preferably, the slow positron source of the invention is used to provide an electronic phantom calibration apparatus which generates arbitrary phantom images for efficient electronic calibration of γ-ray cameras.

In accordance with a preferred embodiment of the invention, a positron source is provided which forms a beam of low energy positrons which are accelerated up to a few keV and focused on an annihilation surface with a diameter near 1 mm so as to create a phantom for γ-ray cameras with numerous advantages over known positron sources. For example, by combining a cylindrical geometry with electrodepositron of the radioisotope on the surface of the primary moderator foil, relatively high moderation yields are achieved in accordance with the invention. Also, since positron annihilation at the selected energies takes place within a few hundred Å of the target surface, a true two-dimensional γ-ray source without collimation is provided which has dimensions much smaller than present detector resolutions. In addition, the invention has an adjustable source intensity which accommodates different detectors or calibration conditions and also permits an unlimited phantom geometry. Indeed, in a preferred embodiment, the positron beam emitted by the positron source of the invention can be electronically manipulated the same way as any electron beam on a CRT. Angular correlation of annihilation γ-rays also can be varied by selection of a target screen material such as quartz, for example, which yields minimal dispersion.

In a preferred embodiment, the positron source has a cylindrical geometry which permits increased conversion efficiency from high energy into low energy positrons. A thin walled inner cylinder is filled with a positron emitting liquid radioisotope and is separated from an outer cylinder by an annular cavity. The outer cylinder surrounds the inner cylinder and is coated with a high atomic number material thick enough to stop all the positrons while providing a high fraction of backscattered positrons. A thin layer of moderator material is also deposited on the inner surface of the outer cylinder. A positively biased pusher disk is placed at one end of the cylinders, while a negatively biased extraction grid is placed at the other end of the cylinders for extracting the low energy moderated positrons from the cavity so as to form a substantially monoenergetic positron beam. The positron beam is directed to impinge upon an annihilation screen at selected points using standard CRT focusing and deflection arrangements. The positron beam is controlled to create a desired phantom image on the annihilation screen. The gamma rays produced by the impingement of the positron beam on the annihilation screen are advantageously measured by a PET or SPECT camera and may be used to calibrate resolution, field of view, and the like of such gamma ray cameras.

The present inventor has also recognized that the annihilation screen may be mounted on a remote manipulator to make possible three-dimensional electronically-controlled phantoms. These and other characteristics features of the invention will become apparent from the following detailed description of the invention.

BRIEF DESCRIPTION OF THE DRAWINGS

The above-mentioned objects and advantages of the invention will become more apparent and more readily appreciated from the following detailed description of presently preferred exemplary embodiments of the invention taken in conjunction with the accompanying drawings, of which.

DETAILED DESCRIPTION OF THE PREFERRED EMBODIMENT

A positron source and γ-ray calibration technique in accordance with presently preferred exemplary embodiments of the invention will be described below with reference to FIGS. 1–8. It will be appreciated by those skilled in the art that the description given herein with respect to those figures is for exemplary purposes only and is not intended in any way to limit the scope of the invention. All questions regarding the scope of the invention may be resolved by referring to the appended claims.

As noted above, improvements in positron moderation yields have primarily originated from better understanding of the physical mechanisms behind the moderation process taking place in a solid. However, moderation efficiencies in the $10^{-3}$ range have only been demonstrated either by using single crystal foils (~1000 Å) as noted by Chen et al. and Schultz et al. or solid rear gases as noted by Mills, Jr. et al. in an article entitled "Solid Neon Moderator for Producing Slow Positrons," Appl. Phys. Lett., Vol. 49, No. 17, pp. 1121–1123, Oct. 27, 1986. These methods require highly sophisticated fabrication and operation techniques like in the case of single crystals or expensive cryogenic equipment for solid rear gases. Since such equipment is not readily available, these techniques are not highly desirable.

The accepted definition for moderator efficiency is given as the ratio between the number of slow positrons leaving the moderator and the number of fast positrons emitted by the source. Self-absorption of the source and the fraction backscattered by the surrounding material are parameters not well defined in most cases. As noted by Massoumi et al. in an article entitled "Positron Emission Yields for Encapsulated $^{22}$Na Sources," Nuclear Instruments and Methods in Physics Research, B30, pp. 592–597 (1988), the estimated transmitted fraction of positrons through a 7 µm Ti window is 0.66, in good agreement with their experimental results. A shifted distribution curve towards lower energies, as compared with source decay in a vacuum, thus results due to the energy degradation effect of the moderator.

Figure 1A:
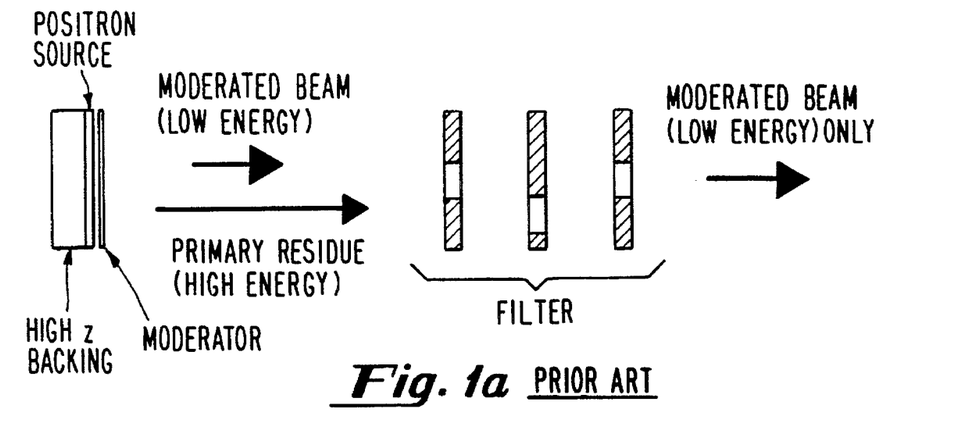
FIGS. 1a–1c illustrate prior art positron source geometries.
Figure 1B:
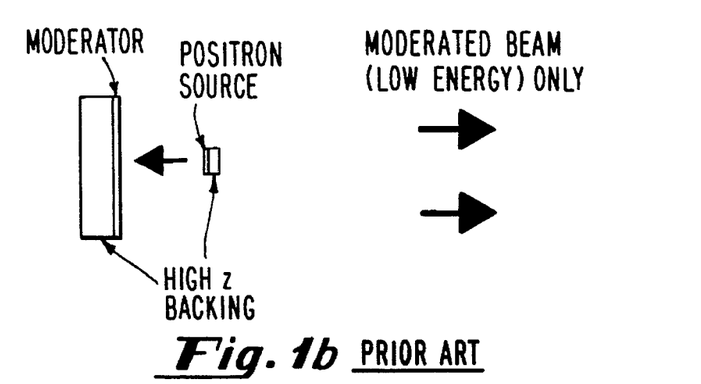
Figure 1C:
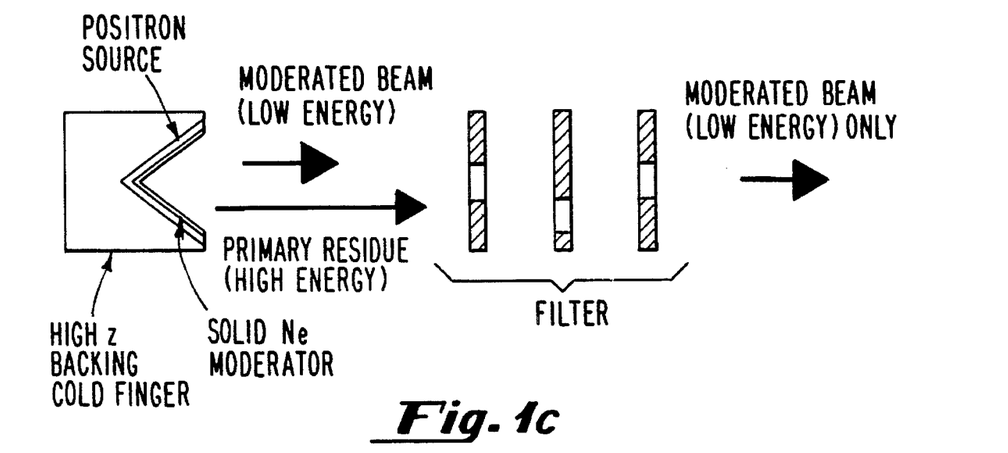

FIGS. 1a–1c show typical source geometries. As shown in FIG. 1a, energetic positrons are a major component of the forward-transmitted beam, and accordingly, appropriate beam filtering needs to be included as part of the low energy source. A high atomic number material is normally used as backing for the primary source, to take advantage of high backscattering fractions. Backscattering geometry as shown in FIG. 1b makes double use of this phenomena to increase the number of energetic positrons available for moderation. Some variations to this geometry have been attempted to reduce the shadow created by the location of the radioisotope source. However, the conical geometry illustrated in FIG. 1c combined with a solid rear gas moderator has produced some of the highest reported moderation yields.

Figure 2:
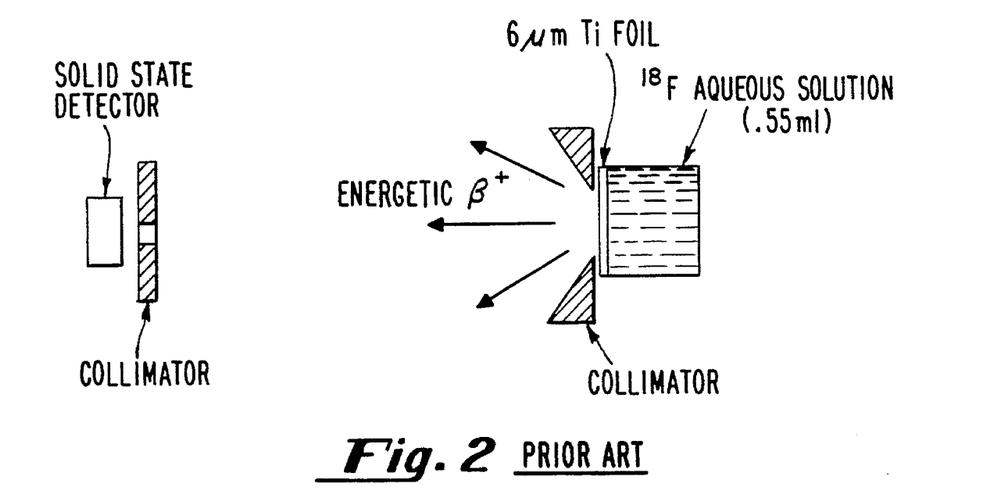
FIG. 2 illustrates an experimental setup including a positron source containing radioisotopes in liquid form for use in studying positron transmission through foils.

Unfortunately, such prior art source configurations do not take full advantage of the large number of energetic positrons not moderated through a first stage. The source illustrated in FIG. 2 was thus developed and tested. As shown, the source of FIG. 2 contains radioisotopes in liquid form. The measured energy spectrum for positrons emitted by $^{18}$F and transmitted through a 6 µm Ti foil was found to show good agreement with calculated distributions such as those presented by Massoumi et al. in the aforementioned article entitled "Positron Emission Yields for Encapsulated $^{22}$Na Sources," Nuclear Instruments and Methods in Physics Research, B30, pp. 592–597 (1988). Indeed, more than 10% of the source activity was measured as energetic positrons emitted into the vacuum chamber. The discrepancy between the 10% value measured with the embodiment of FIG. 2 and the approximately 60% reported by Massoumi et al. can be attributed to the fact that the liquid positron source of FIG. 2 is approximately 6 mm thick. As known by those skilled in the art, a shift towards lower energies, as compared with source decay in a vacuum, reflects the energy degradation effect of the moderator, while high energy β+ still represents a major component of the distribution. Unfortunately, these high energy positrons are normally discarded in conventional source geometries and in most cases represent a contamination to the low energy beam.

Figure 3A:
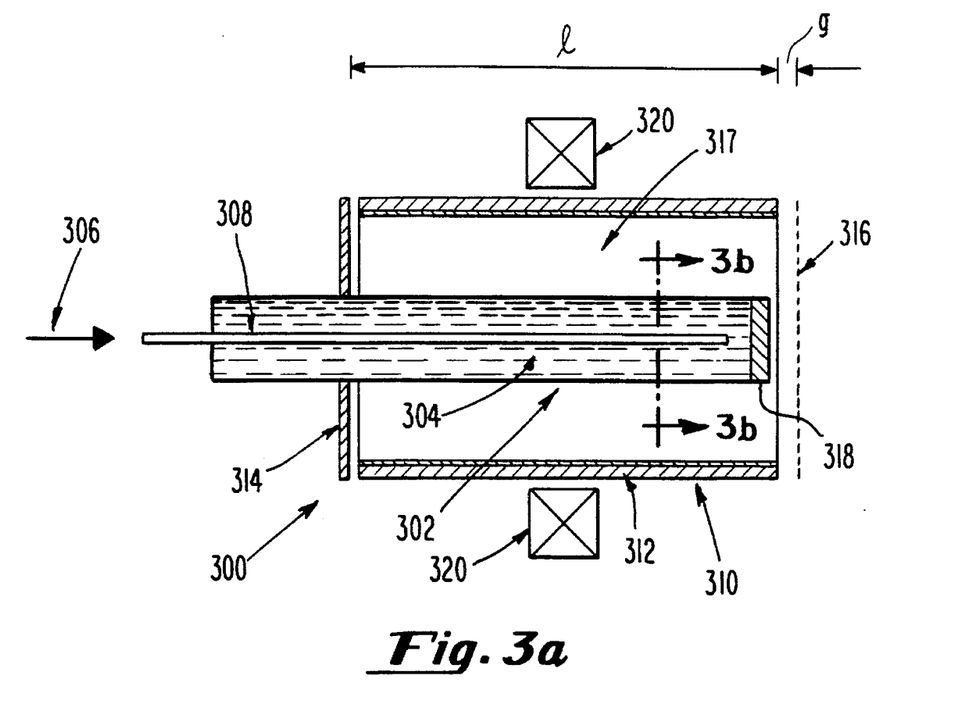
FIG. 3a illustrates a first embodiment of a positron source in accordance with the invention.
Figure 3B:
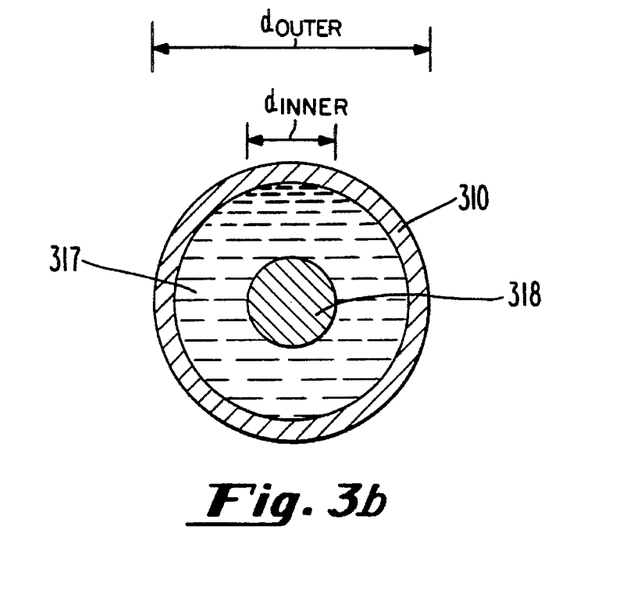
FIG. 3b illustrates a cross-section of the positron source of FIG. 3a taken along line 3—3.

The method in accordance with the invention combines transmission and backscattering geometry while using simple components to avoid the complexities of single crystal manufacturing or cryogenic moderators. FIGS. 3a and 3b illustrate a schematic of a positron source 300 in accordance with a first embodiment of the invention. As shown in FIG. 3a, a thin-walled well-annealed polycrystalline Ni or W inner tube 302 having approximately a 5–20 µm wall thickness and 3 to 10 mm diameter is filled with the positron emitting liquid radioisotope 304. Preferably, inner tube 302 is capable of supporting 1 atmosphere of differential pressure. The radioisotope is injected into inner tube 302 at 306 via an electrically isolated small diameter metal tube 308 placed inside the Ni or W inner tube 302. A larger diameter coaxial cylinder moderator (outer tube) 310 surrounds the inner tube 302 as shown. The inner surface 312 of this outer tube 310 is coated with a high Z material (Au or W, for example) thick enough to stop all the positrons while providing a high fraction of backscattered positrons. A thin layer of an appropriate moderator (W, Ni or an insulator like MgO) is also deposited over the inner surface 312 to moderate the flux of energetic positrons. As noted by Brandes et al. in an article entitled "Positron Workfunction of Diamond C(100) Surfaces," Materials Science Forum, Vol. 105–110, pp. 1363–1366 (1992), diamond is an attractive material for use as such a positron moderator.

At one end of positron source 300, a pusher disk 314 with similar properties as those described for the outer tube 310 is placed to increase production of moderated positrons. Pusher disk 314 is preferably coated with a high atomic number conductive material in order to favor backscatter moderation. The pusher disk 314 is also positively biased with respect to the inner tube 302 to help "push" the low energy positrons out of the positron source 300.

A high transmission extraction grid 316 is placed at the other end of positron source 300 and negatively biased to extract the low energy moderated positrons from the cavity 317. A small stopper disk 318 seals the end of the inner tube moderator 302 and stops energetic positrons from being emitted in the forward direction. Material thickness for the stopper disk 318 is adjusted to optimize the number of slow positrons emitted while minimizing the amount of high energy positrons transmitted depending on the radioisotope used. Finally, a small tunable focusing coil 320 supplies a weak axial magnetic field to improve extraction and focusing characteristics.

Figure 4:
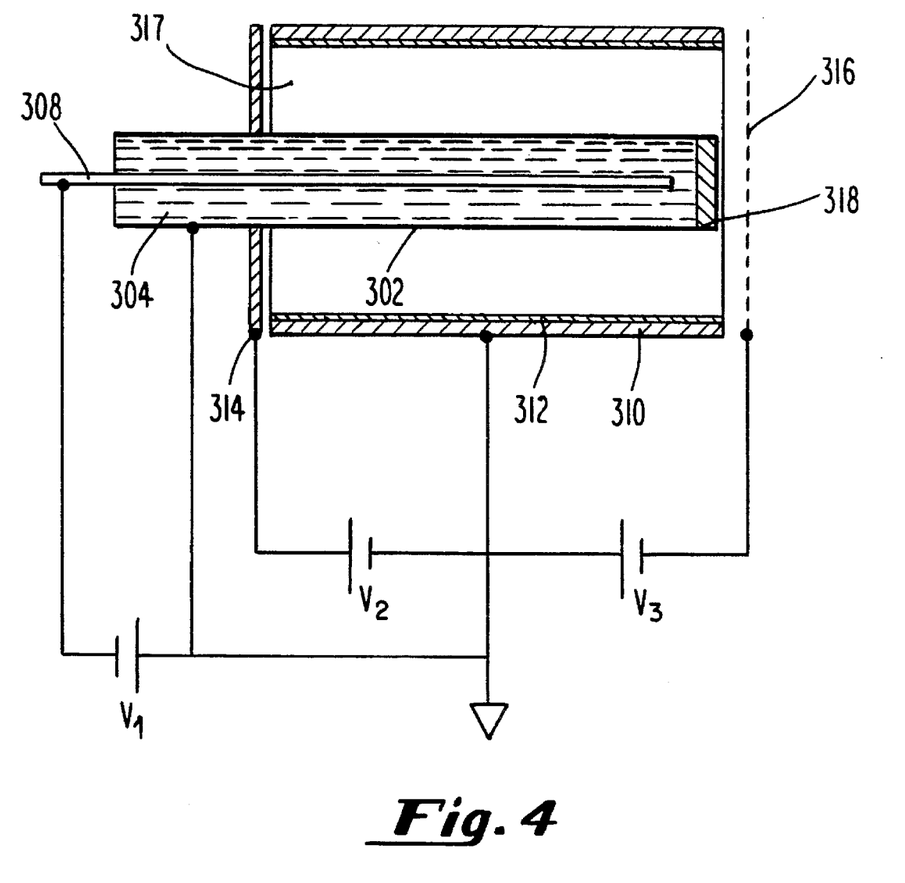
FIG. 4 illustrates the electrical connections to the positron source of FIG. 3.

FIG. 4 shows a diagram of the electrical connections of the positron source 300 of FIG. 3a. Depending on the chemical properties of the radioisotope being used, electrodepositron of the radioisotope 304 over the Ni or W inner tube 302 can be accomplished by applying the appropriate voltage $V_1$ to the small diameter delivery tube 308.

As illustrated in FIG. 3a, the positron source has an overall length l, which is preferably approximately 35 mm, and a distance g from the stopper disk 318 to the extraction grid 316, which is preferably 1 mm. As better illustrated in FIG. 3b, the outer tube 310 has a diameter $d_{OUTER}$, which is preferably approximately 25 mm, while the inner tube 302 has a diameter $d_{INNER}$, which is preferably approximately 6 mm.

Figure 5:
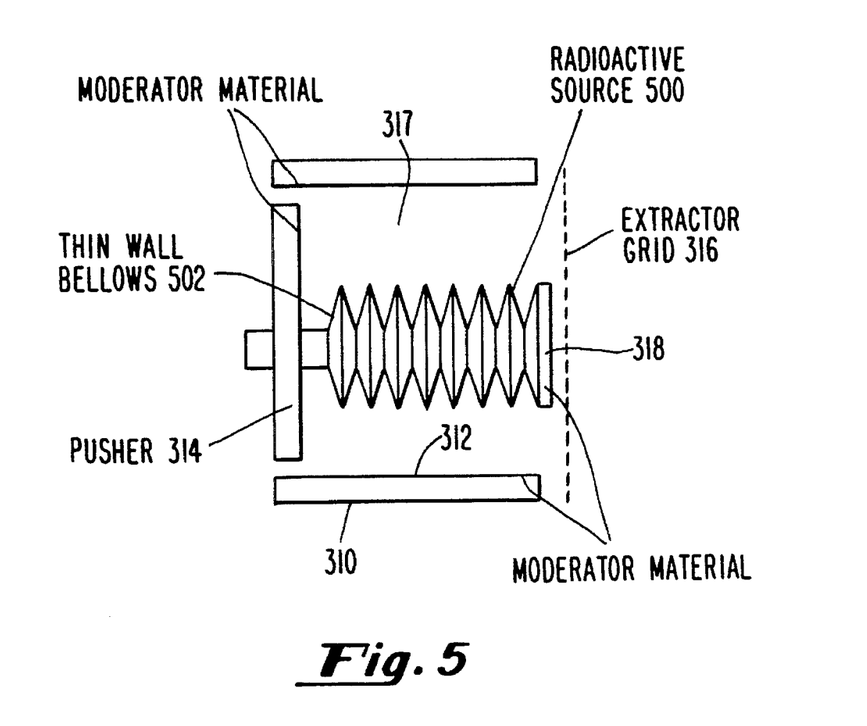
FIG. 5 illustrates a second embodiment of the positron source in accordance with the invention where the cylindrical positron source includes a thin walled Ni bellows around the positron emitting isotope for increasing the positron emitting surface per unit axial length.

An alternative embodiment of a positron source 500 of the invention is illustrated in FIG. 5. In that embodiment, a metal bellows 502 with characteristics similar to the inner tube 302 is provided. As will be apparent to those skilled in the art, metal bellows 502 replaces cylindrical inner tube 302 of the first embodiment so as to increase the positron emitting surface per unit of axial length. The embodiment 500 of FIG. 5 otherwise functions in the same manner as the embodiment illustrated in FIG. 3.

Figure 6:
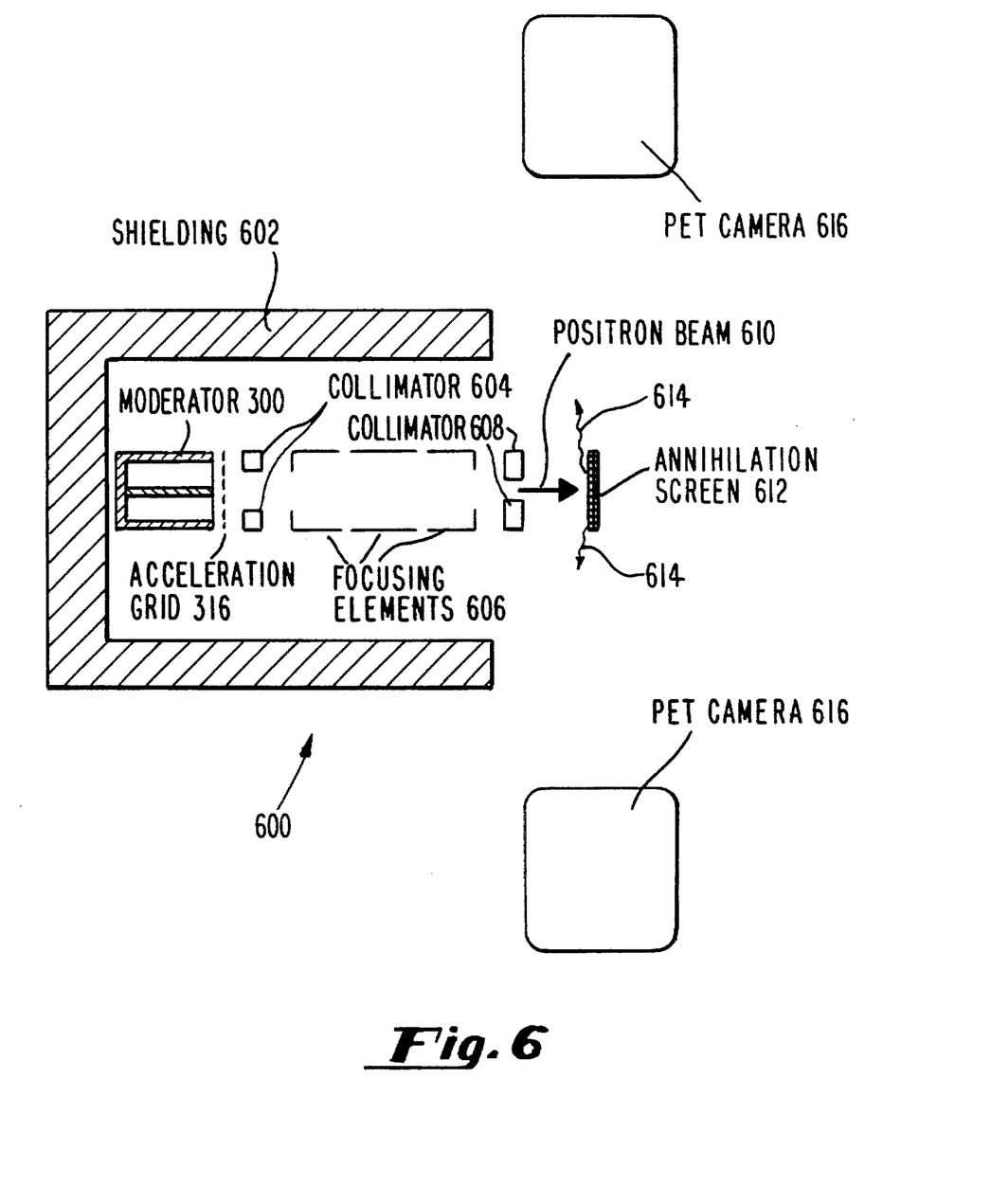
FIG. 6 illustrates a PET camera including a positron source for generating phantoms in accordance with the techniques of the invention.

After extraction and acceleration of a few keV, the positron beam from the positron source 300 or 500 of the invention is preferably collimated, focused, and deflected to finally impinge on an annihilation screen for generation of gamma rays. FIG. 6 illustrates the general setup 600. As shown, the positron source moderator 300 (or 500) is placed within a shielding material 602 such as lead to protect the user from the radioisotope. Also within the shielding 602 is the extractor grid 316, a first collimator 604, focusing elements 606, and a second collimator 608. The positron beam 610 emitted from the second collimator 608 is focused onto an annihilation screen 612 and forms respective gamma rays 614 as a result of the impingement of the positron beam 610 on the annihilation screen 612. If the annihilation screen 612 is placed in the field of view of a PET camera 616, the gamma rays so produced may be measured by PET camera 616 for calibration purposes.

Those skilled in the art will appreciate that the arrangement 600 of FIG. 6 may also be used to calibrate a SPECT camera. In FIG. 6, the focusing elements 606 may include electrostatic as well as magnetic lenses. Preferably, two sets of deflection plates (horizontal-vertical) are used to positron the positron beam 610 anywhere on the annihilation screen 612, as will be described in more detail below with respect to FIG. 8. Preferably, the illustrated arrangement 600 is kept in an evacuated cavity where the pressure inside the cavity is kept below $10^{-3}$ Torr by a small vacuum pump. This prevents the positrons from annihilating before they hit the annihilation screen 612. As will be apparent from the following description of FIGS. 7a and 7b, the details of the beam focusing and deflection in the arrangement 600 of FIG. 6 are very similar to the elements used with standard CRTs.

A permanently sealed configuration including the positron source 300 or 500 with external radioisotope loading and using standard CRT vacuum technology will now be described with respect to FIGS. 7 and 8. Comparisons of the illustrated configuration to a typical electrical configuration for a standard CRT can be made by referring to the CRT illustrated in "Electron Optics," P. Grivet, Pergamon Press Oxford, p. 270, 1965, for example.

Figure 7A:
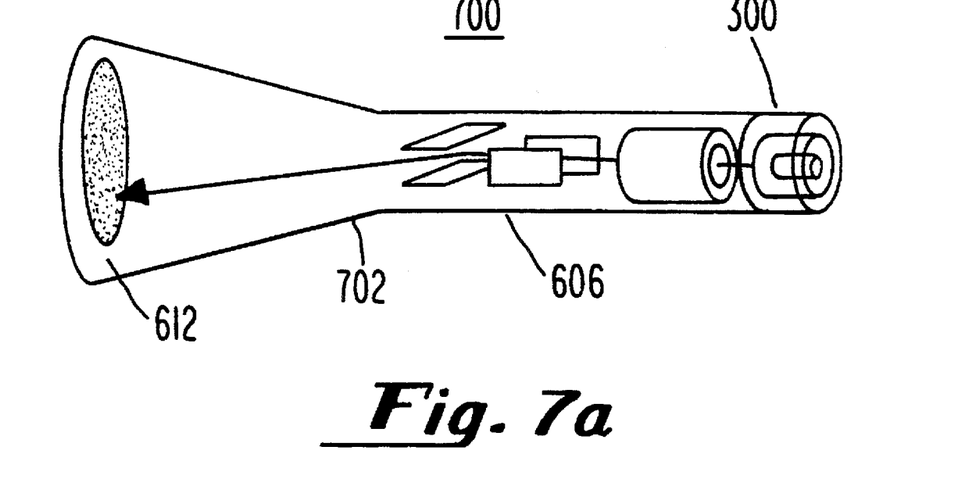
FIGS. 7a and 7b illustrate alternative enclosure configurations for the positron source of the invention.
Figure 7B:
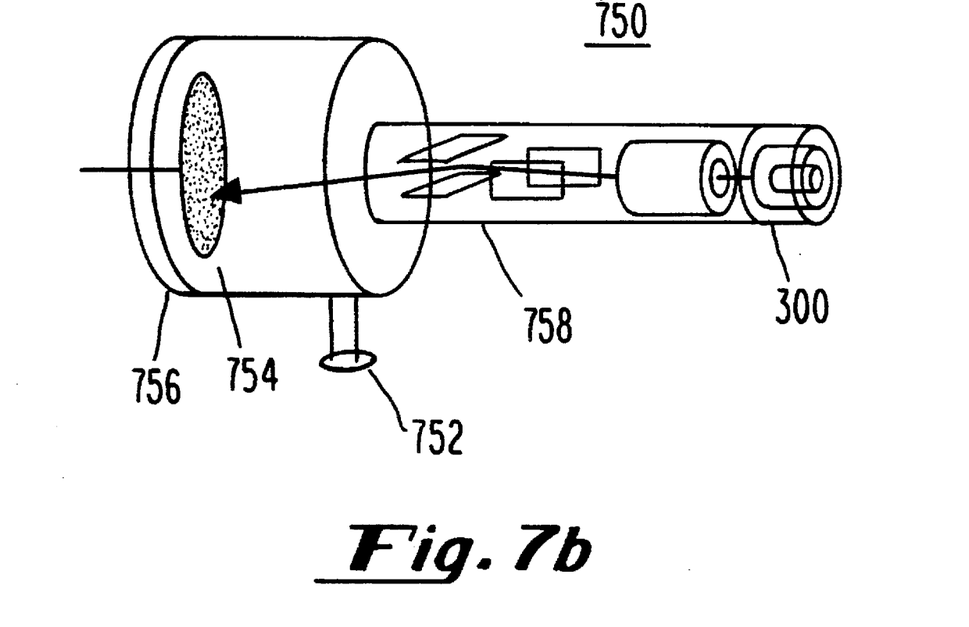

As respectively illustrated in FIGS. 7a and 7b, two different enclosure configurations are proposed for the arrangement 600. As illustrated in FIG. 7a, a permanently sealed configuration 700 with external radioisotope loading using standard CRT vacuum technology provides a simple source for basic applications. As shown, the fixed annihilation screen 612, focusing elements 606, and the moderated positron source 300 (or 500) of the invention are placed within a permanent vacuum glass enclosure 702. Preferably, the liquid radioisotope 304 is provided via metal tube 308 as described above with respect to FIG. 3. Of course, the entire positron source 300 also may be removed and replaced without disturbing the other components or introducing atmospheric pressure into the vacuum glass enclosure 702.

A more sophisticated enclosure 750 is illustrated in FIG. 7b. This embodiment includes an evacuation port 752 and replaceable components such as a movable annihilation screen 754 with vacuum feedthrough, a removable flange 756, and a dismountable vacuum metal enclosure 758 for housing the focusing elements. As in the embodiment of FIG. 7a, the positron source 300 or 500 is mounted at the end of the vacuum enclosure to permit access to the positron source 300 for replenishment of the liquid radioisotope 304 via a removable flange (not shown). Such an embodiment is desirable since it provides more flexibility for demanding applications.

Figure 8:
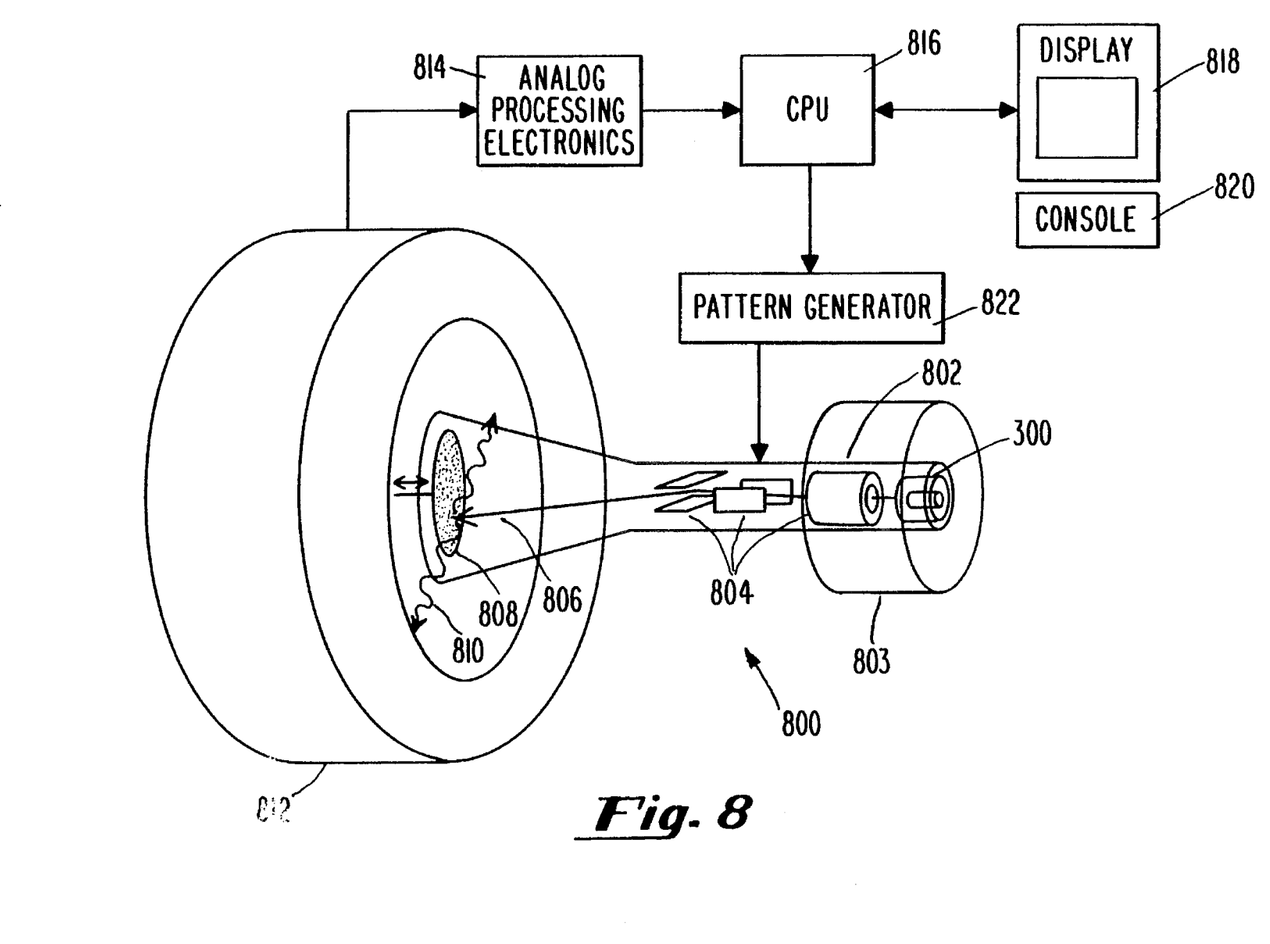
FIG. 8 illustrates the positron source of the invention configured for creating an arbitrary phantom in a PET camera for calibration in accordance with the techniques of the invention.

FIG. 8 illustrates an embodiment 800 of the invention for use in calibrating a PET or SPECT camera. As illustrated, the configuration of FIG. 7a (or 7b) is arranged so that 511 keV gamma rays are created at predetermined positrons within the field of view of the PET or SPECT camera. In particular, the vacuum enclosure 802 is enclosed within a shielding 803 of a material such as lead and arranged such that the moderated positron source 300 is readily accessible for replenishment of the liquid radioisotope 304. Indeed, the overall size of the phantom source permits a cylinder to be used which is only 8" in diameter and 8" long, including 2" or more of lead shielding 803 around the source area. Vacuum enclosure 802 also houses beam optics 804. Those skilled in the art will appreciate that microbeam optics such as described by Brandes et al. in an article entitled "Scanning Positron Microbeam," Rev. Sci. Instrum., Vol. 59, No. 2, pp. 228–232, February 1988, and by Friese et al. in an article entitled "Positron-Beam-Brightness Enhancement: Low-Energy Positron Diffraction and Other Applications," Phys. Rev. B, Vol. 31, No. 9, pp. 5628–5633, May 1, 1985, may be used for the beam optics 804. As noted above with respect to FIGS. 7a and 7b, pressure inside the vacuum enclosure 802 is preferably kept below $10^{-3}$ Torr.

The monoenergetic positron beam 806 (i.e., a positron beam having a small energy spread) produced by the moderated positron source 300 or 500 of the invention is then selectively directed toward annihilation screen 808, where it forms two complementary 511 keV gamma rays 810. These gamma rays 810 are then detected by PET or SPECT camera 812. Since the position at which the positron beam 806 impinges upon annihilation screen 808 may be carefully controlled by beam optics 804, the positron beam 806 may be controlled to create an arbitrary phantom on the annihilation screen 808 for detection by the PET or SPECT camera 812. Also, as shown by the arrows, the annihilation screen 808 may be moved in the axial direction within the PET or SPECT camera 812 in order to create 3-dimensional images.

Processing circuitry then processes the signals indicative of the gamma rays 810 detected by the PET or SPECT camera 812. In particular, signal processing circuitry 814 processes the gamma ray signals in a conventional manner to eliminate background effects and the like. Microprocessor 816 then formats the signals for display on a display device 818. The image on the display device 818 may be manipulated in a known manner via console 820. Also, console 820 may be used in accordance with the invention to designate a desired phantom. In this case, microprocessor 816 instructs beam control unit 822 to generate control signals for the beam optics 804 so that the positron beam 816 forms the desired electronic phantom on the annihilation screen 808. The positron beam intensity, and therefore, the gamma-ray source intensity, can be adjusted, for example, by changing the potential at extraction grid 316. Those skilled in the art will appreciate that by deflecting the positron beam 806 in a controlled manner that an arbitrary electronic phantom may be created in the field of view of the PET or SPECT camera 812.

In the arrangement 800 of FIG. 8, the annihilation screen 808 can be fixed or mounted on a linear vacuum feedthrough and held at a negative potential near 10 kV. Once the positrons of positron beam 806 hit the annihilation screen 808, they travel a very small distance (tenths of a micrometer or less) at this final energy before annihilation occurs and provide two almost collinear γ-rays (511 keV). Of course, the material of the annihilation screen 808 will affect the photons angle. Also, as noted above, moving the annihilation screen 808 along the axial direction of PET or SPECT camera 812 will produce 3D gamma-ray phantoms. Suitable adjustment mechanisms may be provided for so manipulating the annihilation screen 808 under control of the beam control unit 822.

In the configuration 800 illustrated in FIG. 8, a conservative estimate for extraction efficiencies of $10^{-4}$ yields a slow positron flux of 10 µCi from a 100 mCi source focused on a spot smaller than 1 mm diameter by no more than 0.2 µm thick. This lower limit estimate is already well above minimum detectable intensities for current PET or SPECT cameras. A primary source 304 of more than 400 mCi of $^{18}$F, routinely produced at any PET Center from irradiation of a 0.5 ml $H_2^{18}O$ target with protons, combined with conversion efficiencies of $5 \times 10^{-4}$ can yield a 200 µCi beam. A beam of this intensity will scan a 20 cm diameter area in 2 mm×2 mm increments (typical voxel area) in one second while still providing approximately 940 annihilation events per voxel. Electronic modulation of the positron beam 806 also can provide simple patterns for calibration purposes or computer generated phantom images for a larger number of applications. Elements 814–822 are suitable for this purpose. As an example, anatomical characteristics obtained with Magnetic Resonance (MR) techniques can be recreated with the electronic phantom described herein. This computer generated image, acquired with the PET or SPECT scanners, can then be used as an accurate anatomical locator to metabolic functions. In other words, the present invention may be used to assist in the determination of the metabolic functioning of organs such as the brain.

The positron source of the present invention provides numerous advantages over flat source or conical geometries in either backscattering or transmission modes. For example, the coaxial location of the primary source covers a much larger solid angle for those positrons transmitted through the source container wall, thereby increasing the number of primary positrons available for remoderation. Diffusion of the radioisotope to the moderator wall also increases the moderation process by minimizing self absorption of positrons in the liquid phase. The pusher-extractor geometry also provides for a more flexible configuration of the electric field for extraction of low energy positrons than conventional single grid arrangements. In other words, the pusher surface also contributes with backscattered moderated positrons. Also, those skilled in the art will appreciate that a considerable fraction of high energy β+ will be transmitted through the source container wall and will not be disturbed by the relatively weak extraction field. A good fraction of these still energetic positrons will be remoderated and backscattered on the inner surface of the outer cylinder. In addition, source self-absorption is reduced by keeping the source diameter small. Moreover, minimal contamination of the low energy extracted beam with high energy positrons after moderate collimation is made possible by the positron source geometry of the invention.

The positron source of the invention is used in a novel manner to create a point in space where the positrons annihilate to create a source of gamma rays. Such an "electronic phantom" is advantageous in that arbitrary phantom shapes in two and three dimensions may be created without creating background radiation problems as in prior art phantom generation techniques. It also has been illustrated that an experimental configuration using such a positron source may be used to create a phantom for calibrating resolution, field of view, depth measurements, and the like, of PET or SPECT cameras.

While preferred embodiments of the invention have been shown and described herein, those skilled in the art will appreciate that many additional embodiments and modifications are possible within the spirit and scope of the invention. For example, in addition to being used as a source for calibrating a PET or SPECT camera, the positron source of the invention may be used as a 2-dimensional phantom source which requires no collimation of the camera. In addition, the arrangement of the invention may be used to develop new moderator materials as positron sources since trials may be turned around much faster using short-lived radioisotopes. Accordingly, all such modifications are intended to be included within the scope of the invention as defined by the following claims.

What is claimed:

1. A positron source comprising:

an inner cylinder adapted to contain a liquid radioisotope as a source of positrons;

an outer cylinder disposed coaxially with said inner cylinder so as to form an annular cavity therebetween, an inner surface of said outer cylinder being coated with a high atomic number material sufficient to stop positrons emitted from said inner cylinder while also providing a desired fraction of backscattered positrons;

a pusher disk at a first end of said outer cylinder, said pusher disk being positively biased with respect to said inner cylinder to push low energy positrons emitted from said inner cylinder toward a second end of said outer cylinder; and an extraction grid at said second end of said outer cylinder, said extraction grid being negatively biased with respect to said inner cylinder so as to extract low energy positrons from said annular cavity.

2. A positron source as in claim 1, wherein said inner cylinder is formed of one of polycrystalline nickel and tungsten, has a wall thickness of approximately 5–20 microns, and a diameter of approximately 3–10 mm.

3. A positron source as in claim 1, further comprising an electrically isolated metal tube which is inserted into said inner cylinder from said first end and adapted to provide said liquid radioisotope into said inner cylinder.

4. A positron source as in claim 1, wherein said high atomic number material coated on said inner surface of said outer cylinder comprises one of gold and tungsten.

5. A positron source as in claim 1, wherein said inner surface of said outer cylinder is further coated with a thin layer of a moderator for moderating flux of energetic positrons emitted by said inner cylinder and backscattered from said outer cylinder.

6. A positron source as in claim 5, wherein said moderator coated on said inner surface of said outer cylinder comprises one of tungsten, nickel, magnesium oxide, and diamond powder.

7. A positron source as in claim 1, wherein said pusher disk is coated with a high atomic number conductive material.

8. A positron source as in claim 1, further comprising a stopper disk for sealing said inner cylinder at said second end and stopping energetic positrons from being emitted out of said second end of said inner cylinder.

9. A positron source as in claim 8, wherein said stopper disk has a material thickness which is selected in accordance with said radioisotope to optimize the number of low energy positrons emitted while minimizing the amount of high energy positrons emitted therethrough.

10. A positron source as in claim 1, further comprising a focusing coil disposed about said outer cylinder for supplying an axial magnetic field to said outer cylinder so as to improve extraction of said low energy positrons from said annular cavity.

11. A positron source as in claim 3, further comprising means for applying a voltage to said metal tube so as to cause electrodepositron of said radioisotope over an inner surface of said inner cylinder.

12. A positron source as in claim 1, wherein said inner cylinder comprises a substantially cylindrical metal bellows adapted to contain said liquid radioisotope.

13. An apparatus for generating an electronic phantom which functions as a gamma ray source having a predetermined shape, comprising:

a positron source containing a liquid radioisotope which emits a beam of low energy positrons;

an annihilation screen disposed to have said beam of low energy positrons impinge thereon so as to form substantially collinear gamma rays originating at a point of impingement of said beam of low energy positrons on said annihilation screen;

means for focusing said beam of low energy positrons and deflecting said focused beam to said point on said annihilation screen; and means for controlling said focusing an deflecting means to cause said beam of low energy positrons to impinge upon said annihilation screen at predetermined points thereon.

14. An apparatus as in claim 13, wherein said focusing and deflecting means comprises at least one collimator, respective sets of horizontal and vertical deflection plates, and at least one beam focusing member.

15. An apparatus as in claim 13, further comprising a shield disposed around said positron source.

16. An apparatus as in claim 13, further comprising a vacuum enclosure for enclosing said positron source, said annihilation screen, and said focusing and deflecting means, said vacuum enclosure having a pressure therein which is less than approximately $10^{-3}$ Torr.

17. An apparatus as in claim 16, wherein said vacuum enclosure is formed of glass and said positron source is disposed such that said liquid radioisotope can be drained and refilled without introducing atmospheric pressure into said vacuum enclosure.

18. An apparatus as in claim 16, wherein said vacuum enclosure has an evacuation port and said annihilation screen is movable within said vacuum enclosure.

19. An apparatus as in claim 13, wherein said positron source comprises:

an inner cylinder adapted to contain a liquid radioisotope as a source of positrons;

an outer cylinder disposed coaxially with said inner cylinder so as to form an annular cavity therebetween, an inner surface of said outer cylinder being coated with a high atomic number material sufficient to stop positrons emitted from said inner cylinder while also providing a desired fraction of backscattered positrons;

a pusher disk at a first end of said outer cylinder, said pusher disk being positively biased with respect to said inner cylinder to push low energy positrons emitted from said inner cylinder toward a second end of said outer cylinder; and an extraction grid at said second end of said outer cylinder, said extraction grid being negatively biased with respect to said inner cylinder so as to extract low energy positrons from said annular cavity.

20. An apparatus as in claim 13, wherein said controlling means comprises a computer, a display, and a beam control unit responsive to said computer for generating control signals which, when applied to said focusing and deflecting means, cause said beam of low energy positrons to impinge upon said annihilation screen so as to form a predetermined pattern.

21. An apparatus as in claim 13, wherein said annihilation screen is maintained at a negative potential of approximately 10 kV.

22. An apparatus as in claim 13, wherein said annihilation screen is movable along an axis of said beam of low energy positrons so as to change a point of impingement of said beam of low energy positrons on said annihilation screen in a direction along said axis, whereby said annihilation screen is moved to generate a three dimensional impingement of said beam of low energy positrons on said annihilation screen.

23. A method of calibrating a gamma ray camera, comprising the steps of:

generating a substantially monoenergetic positron beam;

directing said positron beam to an annihilation screen within a field of view of said gamma ray camera, said positron beam creating gamma rays originating at points of impingement of said positron beam on said annihilation screen;

controlling said beam to impinge upon said annihilation screen at desired points thereon so as to create a desired phantom source of gamma rays within said field of view of said gamma ray camera; and said gamma ray camera detecting said gamma rays generated by said desired phantom source.

24. A method as in claim 23, wherein said controlling step comprises the step of moving said annihilation screen in a direction parallel to said positron beam so as to generate a three dimensional phantom source.

\* \* \* \* \*

UNITED STATES PATENT AND TRADEMARK OFFICE
CERTIFICATE OF CORRECTION

PATENT NO. : 5,502,303
DATED : March 26, 1996
INVENTOR(S) : Carlos Gonzalez-Lepera It is certified that error appears in the above-indentified patent and that said Letters Patent is hereby corrected as shown below:

Col. 8, line 8, change "positron" to --position--.

Col. 11, line 56, change "electrodepositron" to --electrodeposition--.

Signed and Sealed this

Sixteenth Day of July, 1996

Attest:

BRUCE LEHMAN

Attesting Officer     Commissioner of Patents and Trademarks